United States Patent [19]

Lebeau

[11] Patent Number: 5,115,475
[45] Date of Patent: May 19, 1992

[54] AUTOMATIC SEMICONDUCTOR PACKAGE INSPECTION METHOD

[75] Inventor: Christopher J. Lebeau, Tempe, Ariz.

[73] Assignee: Motorola, Inc., Schaumburg, Ill.

[21] Appl. No.: 532,779

[22] Filed: Jun. 4, 1990

[51] Int. Cl.$^5$ ............................................. G06K 9/00
[52] U.S. Cl. ....................................... 382/8; 382/55; 358/101; 358/106
[58] Field of Search ............... 382/8, 54, 55; 358/106, 358/101; 356/237

[56] References Cited

U.S. PATENT DOCUMENTS

| 3,814,845 | 6/1974 | Hurlbrink, III et al. | 178/6.8 |
| 4,509,075 | 4/1985 | Simms et al. | 358/106 |
| 4,688,939 | 8/1987 | Ray | 356/237 |
| 4,696,047 | 9/1987 | Christian et al. | 382/8 |
| 4,851,902 | 7/1989 | Tezuka et al. | 358/101 |
| 4,969,199 | 11/1990 | Nara | 382/8 |
| 4,975,971 | 12/1990 | Ohnishi | 382/8 |

FOREIGN PATENT DOCUMENTS 0288553 12/1987 Japan ............................. 356/237

OTHER PUBLICATIONS

Maragos, "Tutorial on Advances in Morphological Image Processing and Analysis", *Optical Engineering*, vol. 26, No. 7, Jul. 1987, pp. 623-632.

*Primary Examiner*—Leo H. Boudreau
*Assistant Examiner*—Andrew W. Johns
*Attorney, Agent, or Firm*—Joe E. Barbee; Stuart T. Langley

[57] ABSTRACT

A visual lead-finger inspection method is provided comprising obtaining an image of a semiconductor package and enhancing an image of lead-fingers which are a part of the package. In a first embodiment the image enhancement comprises morphological opening, and in an alternate embodiment comprises direction edge enhancement. A logical AND operation is performed with the enhanced lead-finger image and a frame image which is placed through the lead-finger image, resulting in a data set of only a few hundred bytes which describes position, alignment and lead count of all of the lead-fingers on the package. The data set is compared to a stored data set to determine acceptability of the semiconductor package.

8 Claims, 5 Drawing Sheets

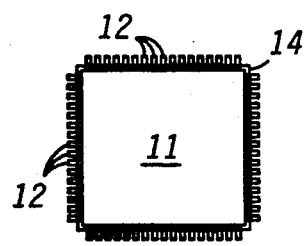
FIG. 1A
FIG. 1B
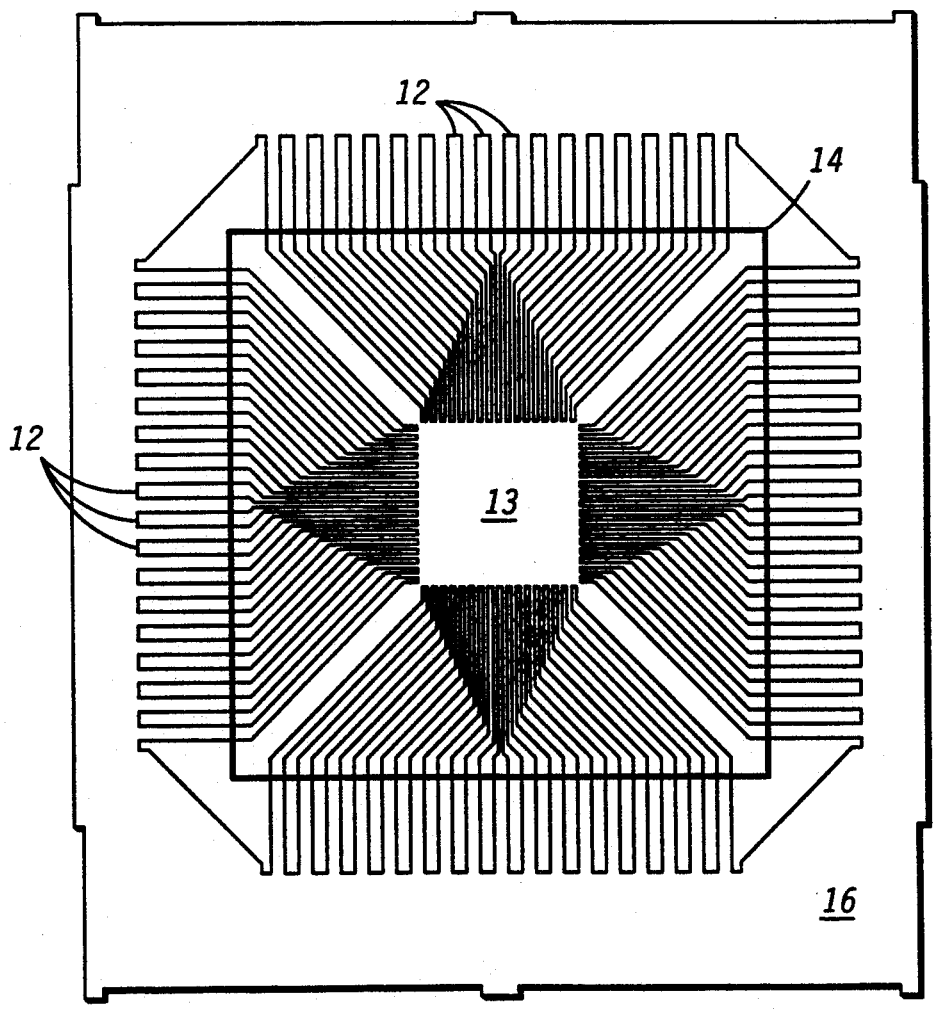

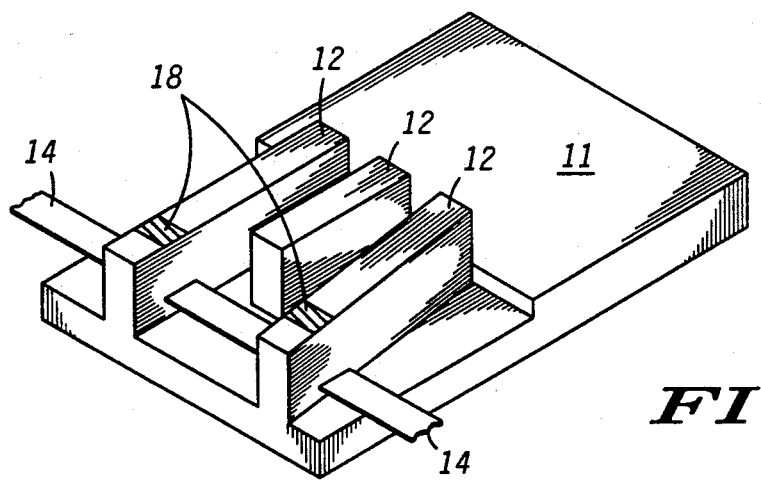
FIG. 5
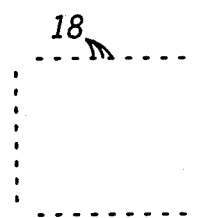
FIG. 6
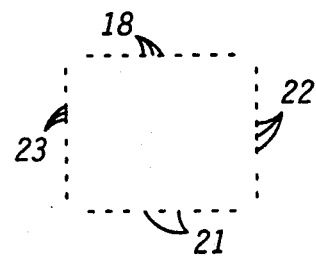
FIG. 7
FIG. 8
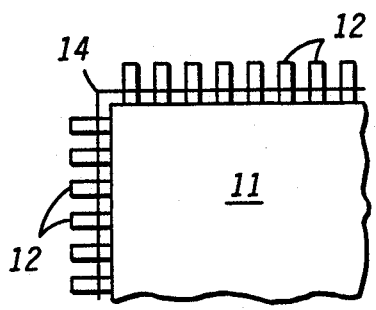
FIG. 9
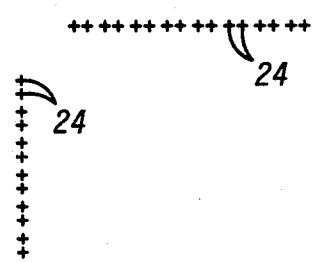

AUTOMATIC SEMICONDUCTOR PACKAGE INSPECTION METHOD

BACKGROUND OF THE INVENTION

This invention relates, in general, to methods for automatically inspecting semiconductor packages, and more particularly, to a method for automatically inspecting high lead count semiconductor packages.

During the assembly of semiconductor components it is necessary to verify the location, alignment, and condition of various portions of the package. This is particularly true in an automated or semi-automated assembly cycle. In the manufacture of semiconductor devices it is also important to inspect the semiconductor package before shipping to ensure that package lead-fingers are in proper alignment and have not been damaged during assembly. Recently, solid state television cameras have been used to visually monitor semiconductor packages. The data from the camera can then be processed in a digital manner to determine the coordinate location of the semiconductor package and leads. However, the manner in which the data is processed determines speed, accuracy, and robustness of the monitoring system.

A digital image from an industrial camera is broken into picture elements, or pixels. Even when gray scale images are used, each pixel requires a byte of digital data to describe its intensity; commonly an unprocessed digital image will require in the order of 256 thousand bytes of data. Digital processing of a visual image for automatic inspection involves reducing this large amount of image data to a minimum data set while retaining information about important characteristics of the package. Important characteristics are lead-finger dimensions and spacings which must meet predetermined specifications. To determine acceptability of the semiconductor package under inspection the data set must be compared to some standard or specification. One common problem in image analysis is that results are very sensitive to background lighting, reflectivity, and magnification of the image under inspection. Since these conditions are quite variable in a production environment, image comparison or image correlation techniques are difficult to use in a production inspection operation and require a great deal of manual intervention. It is desirable to have an automatic inspection system which is highly immune to the effects of variable lighting conditions, and which is highly tolerant of normal, acceptable variations between leadframes while being quite sensitive to unacceptable variations.

In particular, high lead count semiconductor packages pose difficult problems in both data reduction and data analysis. Due to the large number of leads which must be inspected, data reduction to a minimal data set is necessary for speedy processing and analysis. On the other hand, this data reduction must not impair the systems ability to detect unacceptable defects in the package. Characteristics of primary importance are lead-finger count, lead alignment and lead spacing.

Accordingly, it is an object of the present invention to provide an improved method of manipulating data to automatically inspect a high lead count semiconductor package.

Another object of the present invention is to provide a method to automatically inspect a large number of lead-fingers in a manner that is fast and accurate.

Yet another object of the present invention is provide a method to analyze visual data against a predetermined specification in a real time fashion.

Another object of the present invention is to use image enhancement techniques together with logical AND operations to vastly reduce size of a data set which describes characteristics of a leadframe.

Still another object of the present invention is to use morphological dilation and skeletonization techniques to increase the robustness of an image analysis system.

SUMMARY OF THE INVENTION

The above and other objects and advantages of the present invention are achieved by a visual lead-finger inspection method comprising obtaining an image of a semiconductor package and enhancing an image of lead-fingers which are a part of the package. In a first embodiment the image enhancement comprises morphological opening, and in another embodiment comprises direction edge enhancement. A logical "AND" operation is performed with the enhanced lead-finger image and a frame image which is placed through the lead-finger image, resulting in a data set of only a few hundred bytes which describes position, alignment and lead count of all of the lead-fingers on the package. The data set is preferably compared to a stored data set to determine acceptability of the semiconductor package.

BRIEF DESCRIPTION OF THE DRAWINGS

FIG. 1A illustrates completed semiconductor package that can be automatically inspected by the present invention;

FIG. 1B illustrates semiconductor leadframe that can be automatically inspected by the present invention;

FIGS. 2-5 illustrate various stages of of a morphological open process used to enhance an image of lead-fingers shown in FIGS 1a and 1b;

FIGS. 6 and 7 illustrate in graphic form reduced data sets generated by the method of the present invention;

FIGS. 8 and 9 illustrate use of direction edge enhancement techniques with the method of the present invention.

DETAILED DESCRIPTION OF THE DRAWINGS

Figure 2:
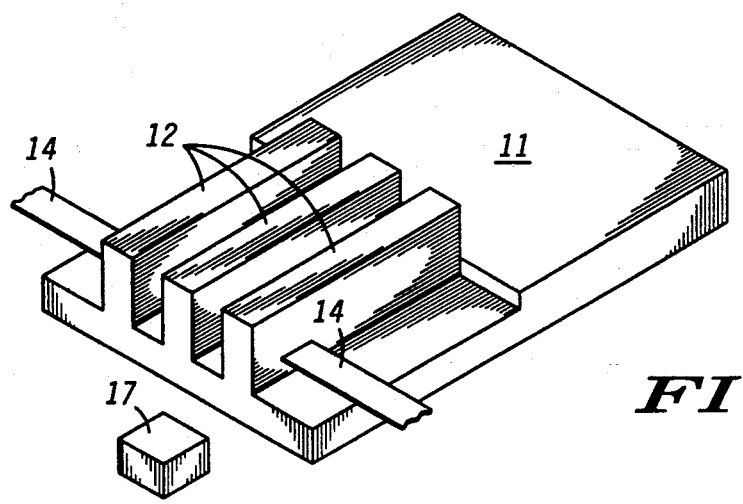

FIG. 1A illustrates an image semiconductor package comprising a plurality of leads 12 which extend from package body 11. A semiconductor device is mounted inside package body 11 and electrically coupled to leads 12. A frame image 14 is used in the package inspection method of present invention but is not itself a part of the semiconductor package. Frame image 14 is placed so that it passes through a portion of leads 12 which is to be inspected. The purpose and function of frame image 14 will be explained hereinbelow in reference to the other figures.

FIG. 1B illustrates a leadframe which also can be inspected using the method of the present invention. Leadframe 11 comprises a plurality of leads 12. The integrated circuit is mounted in the central portion 13 of leadframe 16 and coupled to an inner portion of leads 12 which is nearest to die mount portion 13. The method of the present invention can be used to inspect any portion of leads 12, but of particular interest are an outer portion which is away from die mount area 13 and an inner portion which is immediately adjacent to die mount area 13. Frame image 14 is projected so as to pass through leads 12 as shown in FIG. 1B. It should be understood that frame image 14 can be of any size, and can be projected onto any portion of leads 12 which is to be inspected. Also, several frame images 14 can be projected simultaneously in order to inspect several portions of leads 12. As in FIG. 1A, frame image 14 is not a component of leadframe 16 but is instead is projected onto leadframe 16 for purposes of the inspection method of the present invention.

The present invention involves a learn mode and a run mode. During the learn mode a sample semiconductor package resembling either FIG. 1A or FIG. 1B is placed before an industrial television camera and an image of the package or leadframe is obtained. In learn mode an operator manually positions window 14 through leads 12. Window 14 is used to identify a portion of interest of leads 12 which is to be inspected to meet predetermined criteria. The sample package should be reasonably free of defects, have the proper number of leads 12, and have leads 12 which are reasonably well aligned. Since leadframe 16 shown in FIG. 1B is a component of finished packaged 11 shown in FIG. 1A, it may be desirable to compare leads 12 of the finished package to leads 12 of an unprocessed leadframe 16. As will be seen, the method of the present invention is useful for such an inspection technique.

After an image of leadframe 16 or package 11 is obtained, a sub-image of leads 12 is enhanced to reduce the quantity of data required and to improve robustness of the inspection method. In a first embodiment lead finger image enhancement comprises morphological opening of the lead finger image. FIG. 2 graphically illustrates the first step in the process of morphological opening of the lead finger image. FIG. 2 illustrates a three-dimensional gray scale image of lead fingers 12 and die mount portion 13. Frame image 14 is also shown in FIG. 2 passing through lead fingers 12. The three-dimensional image shown in FIG. 2 is developed from a two-dimensional gray scale image obtained by the industrial television camera. The third dimension represents light intensity which is reflected from package body 11 and leads 12. This three-dimensional image is probed from a bottom surface using a probe 17. Probe 17 is merely any convenient three-dimensional shape such as a sphere or cube which is then probed through the entire image shown in FIG. 2. Probe 17 must be sized so that it is larger than any features of interest such as lead fingers 12.

Figure 3:
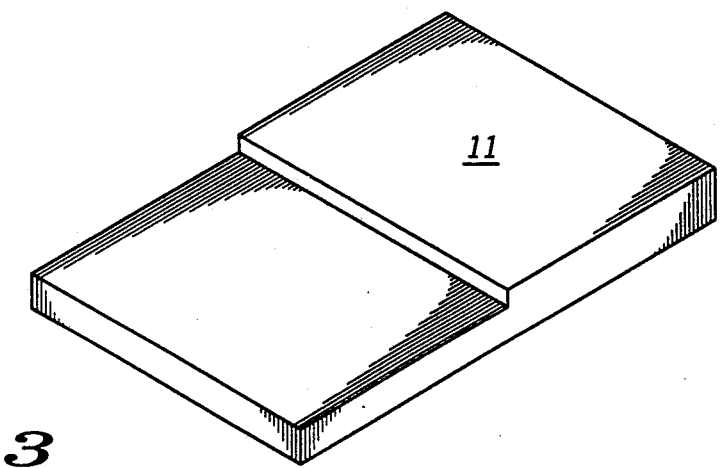
Figure 4:
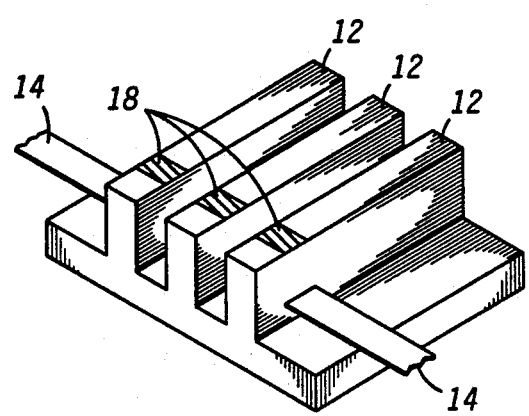

FIG. 3 illustrates the portion of the three-dimensional image shown in FIG. 2 which can be probed by probe 17. Lead fingers 12 are too small for probe 17. The final step in the morphological open operation is to subtract the image shown in FIG. 3 from the image shown in FIG. 2 resulting in the three-dimensional image shown in FIG. 4 which contains only lead fingers 12. Frame image 14 is also shown in FIG. 4 passing through lead images 12. A logical AND operation is performed with frame image 14 and lead finger image 12 resulting in a data set graphically illustrated by areas 18. Areas 18 are as wide as frame 14 and as long as the width of leads 12. Areas 18 include all the information for the width of leads 12, spacing of leads 12, and alignment of leads 12. It should be apparent that the size of the data set comprising areas 18 is dramatically smaller than the data required for the entire image of either package 11 or leadframe 16 shown in FIGS. 1A and 1B.

FIG. 5 illustrates the morphological open of a leadframe having a misaligned lead 12 and one missing lead 12. It can be seen that areas 18 accurately reflect these flaws in leads 12 once the logical AND operation is performed.

In the method of the present invention a sample package is inspected using the morphological open and logic AND procedure described hereinbefore. FIG. 6 illustrates a resulting mask, or template 19, containing areas 18. The sample package should be reasonably free of imperfections and have reasonably correct alignment of leads 12 as shown in FIG. 6. Mask 19 comprising data points 18 will be similar whether a complete semiconductor package as shown in FIG. 1A is used or a semiconductor leadframe as shown in FIG. 1B is used. In this manner, a completed package can be compared against an unprocessed leadframe 16. This may be advantageous in that unprocessed leadframe 16 should be comparatively free of defects which may occur during assembly processes.

FIG. 7 illustrates the resulting mask 20 of a package under inspection having flaws such as missing leads 21, misaligned leads 22, and joined leads 23. Each of these defects 21-23 can be easily identified by comparing the template 20 shown in FIG. 7 with the sample template 19 shown in FIG. 6. As a result of the vastly reduced data set size this comparison can be done quickly and efficiently in an on-line inspection procedure.

FIG. 8 illustrates a second embodiment of the present invention wherein the enhancement of leads 12 is achieved by direction edge enhancement procedures. FIG. 8 illustrates a direction edge enhanced image of the semiconductor package shown in FIG. 1A. A direction edge enhancement results in an image comprising a series of edges which connect to form the shape shown in the original image. The direction edge enhanced image, however, does not retain data for the image intensity throughout the image, but instead contains information only for the edges, or outlines of each shape. Frame image 14, which is superimposed on leads 12, thus crosses two points in each lead 12.

FIG. 9 illustrates the cross points 24 which result when the direction edge enhanced image shown in FIG. 8 is logically ANDed with frame image 14. Points 24 together form a data set indicated generally by 26 which contains all of the information for the size, location, and alignment of leads 12. Each lead is represented by only two data points 24 and thus the size of data set 26 is greatly reduced in comparison to the original data of the entire image.

As with the use of morphological opening, a sample data set 26 is generated from a sample part and an inspection data set 26 is generated from a package under inspection. Inspection data set 26 is compared to sample data set 26 during an on-line real time inspection procedure. It is important to note that with either morphological opening or direction edge enhancement procedures a sample package need only be inspected once during learn mode while many thousands of packages can be compared to that sample package during run mode.

Improved robustness is achieved using morphological operations such as morphological dilation and morphological skeletonization of the direction edge enhanced image or the morphologically opened image. For example, the enhanced image (either morphologically opened or direction edge enhanced) of the sample package is preferably dilated before the logical AND operation. The dilation process grows the enhanced image of lead fingers 12 one pixel at a time to any desired degree. The dilated image contains all of the information of the original image but appears somewhat larger. This larger image can be used to allow for some degree of misalignment of leads 12 which is acceptable.

In addition to or in place of the dilation procedure the enhanced image of the package under inspection may be skeletonized. Skeletonization is the opposite of dilation in that instead of swelling the image, the image gradually eroded one pixel at a time resulting in an image which contains all of the information of the original image but is somewhat smaller. Using these techniques the image of the package under inspection can be compared against the sample image to see if the package under inspection fits with the inside sample image. These techniques greatly increase the robustness of the image processing system and account for variability and magnification and alignment which result in a typical inspection system. This increased robustness greatly reduces the need for operator intervention while maintaining the accuracy of the inspection system.

Figure 10:
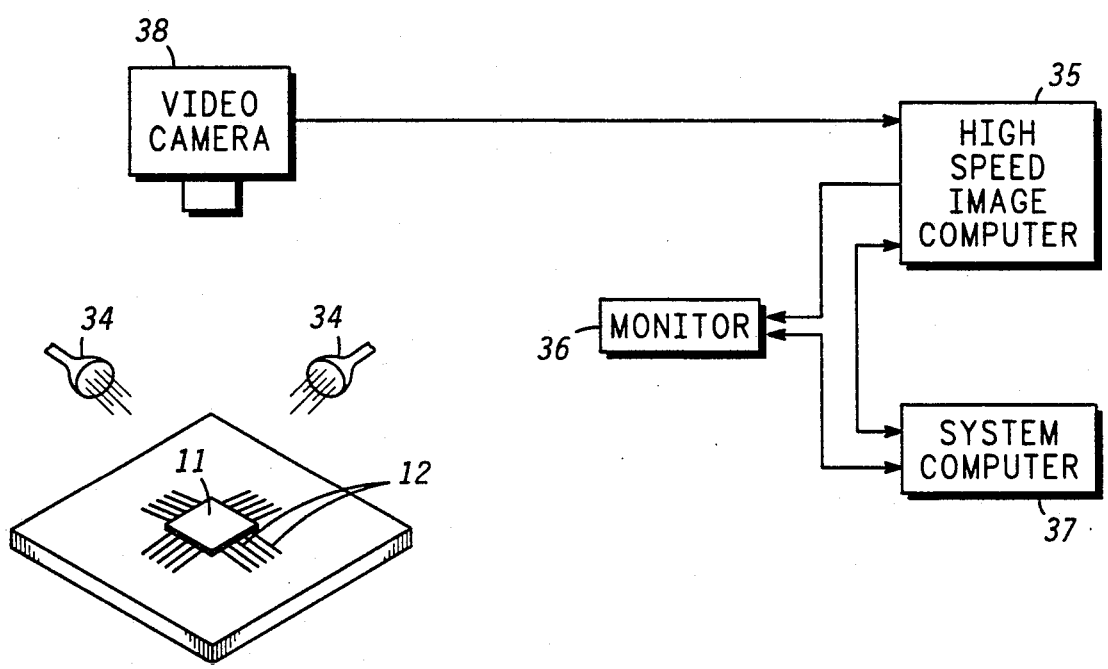
FIG. 10 illustrates a highly simplified illustration of an apparatus embodying the method of the present invention.

A highly simplified illustration of an apparatus embodying the method of the present invention is shown in FIG. 10. Semiconductor package 11 and leads 12 are illuminated by light sources 34. An industrial video camera 38 detects the image from semiconductor packages 11 and feeds the image information to high speed image computer 35. High speed image computer 35 is particularly adapted for processing both binary and gray level images and performing such functions as direction edge enhancement, morphological dilation, and morphological skeletonization. This processed image is then sent to monitor 36 on which an operator can visually observe the inspection process. High speed image computer 35 is also coupled to system computer 37 which performs such functions as determining a location, size, and shape of various features and defects on leads 12.

Figure 11:
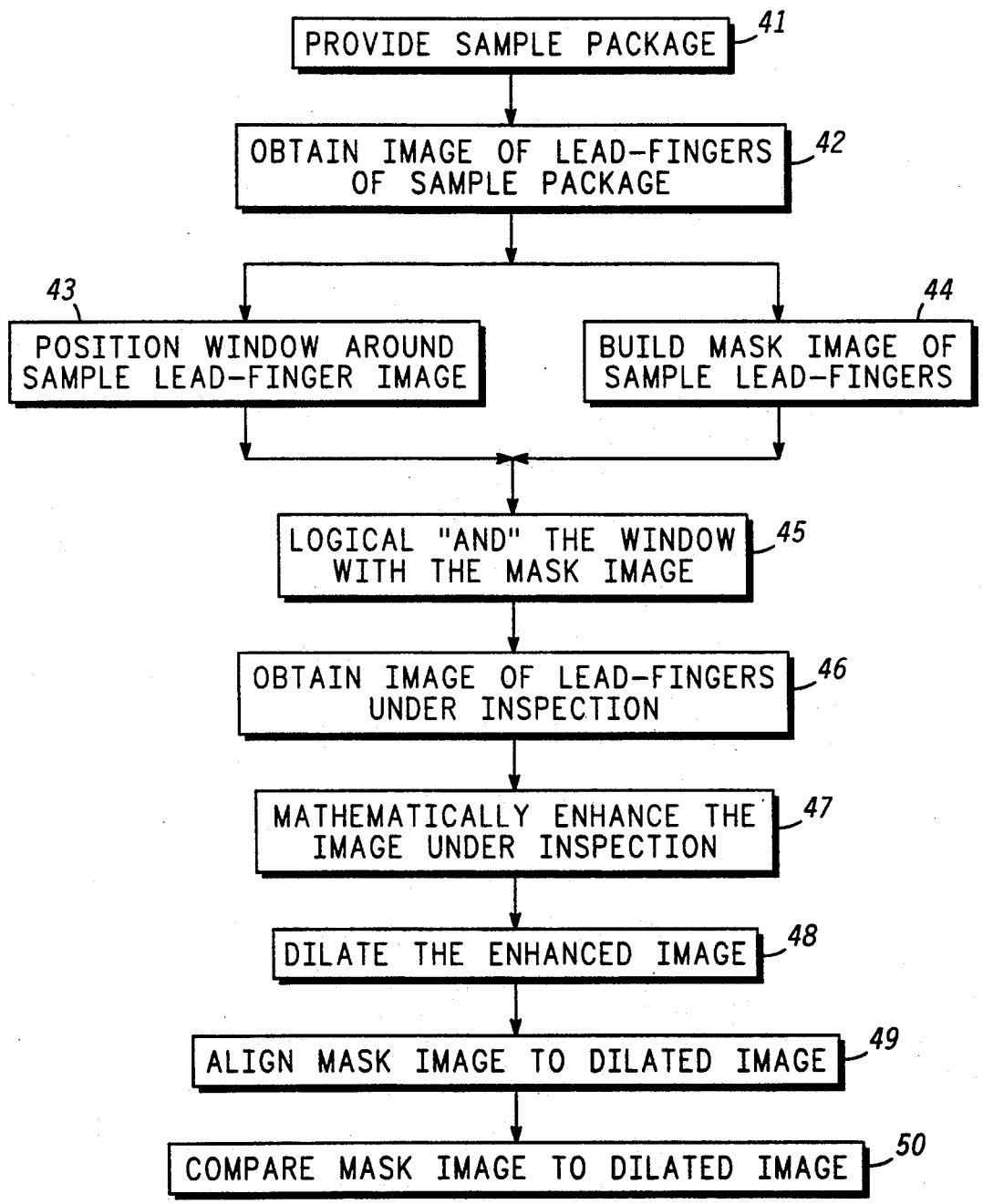
FIG. 11 illustrates a flow diagram for the method of the present invention.

FIG. 11 illustrates a flow diagram of the method of the present invention. A sample package is provided as is shown in block 41 and an image of leadfingers of the sample package is obtained as shown in block 42. At this stage, a window is positioned around the sample lead-finger image as shown in block 43 and a mask image is built of the sample leadfingers as shown in block 44. The process step shown in blocks 43 and 44 may be performed in either order or simultaneously. Next, the window is logically ANDed with the mask image as shown in block 45. Next, an image is obtained of leadfingers of a package under inspection and the image is mathematically enhanced as shown in blocks 46 and 47. The enhanced image is dilated and the mask image is aligned to the dilated image as shown in blocks 48 and 49. Once the mask image is aligned, the mask image is compared to the dilated image as shown in block 50 to determine acceptability of the semiconductor package 11 under inspection.

By it will be appreciated that there is provided a real time automatic visual inspection process for high lead count semiconductor packages and leadframes. An image of a leadframe is obtained and an image of lead fingers is enhanced using morphological opening or direction edge enhancement techniques. During learn mode, the enhanced image of a sample package is dilated to make it slightly larger than the original image. During run mode the enhanced image of the package under inspection is preferably skeletonized to make it somewhat smaller. The modified enhanced image is logically ANDed with a frame image which is projected through the lead images. The logical AND operation results in a reduced data set containing all of the information on lead, alignment, spacing, and size while at the same time being small enough to rapidly process in a real time automatic inspection system.

I claim:

1. A method of automatically inspecting lead-fingers of a semiconductor package comprising: providing a sample package; obtaining an image of lead-fingers of the sample package; positioning a window around the sample lead-finger image; building a sample mask image from the sample lead-finger image; logical ANDing the window with the sample mask image; obtaining an image of lead-fingers under inspection; mathematically enhancing the image under inspection; dilating the enhanced image; aligning the mask image to the dilated image; and comparing the mask image to the dilated image to determine acceptability of the lead-fingers.

2. The method of claim 1 wherein the step of building a sample mask image further comprises morphologically opening the image of the lead-fingers.

3. The method of claim 1 wherein the step of building a sample mask image further comprises direction edge enhancement of the lead-finger image.

4. A method of automatically inspecting lead-fingers of a semiconductor leadframe comprising: obtaining an image of the leadframe, including an image lead-fingers which are a part of the leadframe; enhancing the image of the lead-fingers; skeletonizing the enhanced lead-finger image placing a frame image through the enhanced lead-finger image; performing a logical AND of the enhanced lead-finger image with the frame image to provide a set of data describing the lead-fingers; and comparing the set of data to a predetermined standard to determine acceptability of the lead-fingers.

5. The method of claim 4 wherein the step of enhancing the image comprises morphological opening of the lead-finger image.

6. The method of claim 4 wherein the step of enhancing the image comprises direction edge enhancement of the lead-finger image.

7. The method of claim 4 wherein the predetermined standard comprises another data set generated from an image of a sample leadframe, wherein the other data set is generated by obtaining an image of the sample leadframe; enhancing an image of sample lead-fingers which are a part of the sample leadframe image; placing the frame image through the enhanced sample lead-frame image; and performing a logical AND operation of the frame image with the enhanced sample lead-finger image.

8. The method of claim 7 further comprising the step of performing morphological dilation of the enhanced image of the sample lead-fingers before the step of performing the logical AND operation of the frame image with the enhanced sample leadfinger image.

* * * * *